United States Patent
Doering et al.

(10) Patent No.: US 8,591,856 B2
(45) Date of Patent: Nov. 26, 2013

(54) SINGLE CRYSTAL DIAMOND ELECTROCHEMICAL ELECTRODE

(75) Inventors: Patrick J. Doering, Holliston, MA (US); Robert C. Linares, Wellifleet, MA (US); Alicia E. Novak, Denver, CO (US); John M. Abrahams, Scarsdale, NY (US); Michael Murray, Mountain View, CA (US)

(73) Assignee: SCIO Diamond Technology Corporation, Greer, SC (US)

( * ) Notice: Subject to any disclaimer, the term of this patent is extended or adjusted under 35 U.S.C. 154(b) by 0 days.

(21) Appl. No.: 11/277,866

(22) Filed: Mar. 29, 2006

(65) Prior Publication Data

US 2006/0261349 A1  Nov. 23, 2006

Related U.S. Application Data

(60) Continuation-in-part of application No. 10/977,267, filed on Oct. 29, 2004, which is a division of application No. 09/312,326, filed on May 14, 1999, now Pat. No. 6,582,513.

(60) Provisional application No. 60/085,542, filed on May 15, 1998.

(51) Int. Cl.
*C30B 29/04* (2006.01)

(52) U.S. Cl.
USPC .............. 423/446; 117/94; 117/95; 117/104; 117/15; 117/929

(58) Field of Classification Search
USPC .............. 117/94, 95, 104, 105, 929; 423/446
See application file for complete search history.

(56) References Cited

U.S. PATENT DOCUMENTS

| | | |
|---|---|---|
| 3,850,591 A | 11/1974 | Wentorf, Jr. |
| 4,034,066 A | 7/1977 | Strong et al. |
| 4,767,608 A | 8/1988 | Matsumoto et al. |
| 4,816,286 A | 3/1989 | Hirose |
| 4,905,227 A | 2/1990 | Lechner et al. |

(Continued)

FOREIGN PATENT DOCUMENTS

| | | |
|---|---|---|
| DE | 19718517 | 11/1998 |
| EP | 0390209 A2 | 10/1990 |

(Continued)

OTHER PUBLICATIONS

Pupunat et al Electrochemical Water Disinfection with boron doepd diamond (bdd) electrodes, CSEM Science Report 2001 pp. 59-63.*

(Continued)

*Primary Examiner* — Bob M Kunemund
(74) *Attorney, Agent, or Firm* — Schwegman Lundberg & Woessner, P.A.

(57) ABSTRACT

An electrolytic cell includes a container for holding an electrolyte. A conductively doped single crystal diamond anode electrode is positioned to be disposed within the electrolyte, as is a conductive cathode electrode. Conductors are coupled to the electrodes for coupling to a power supply. An electrolyte inlet and an electrolyte outlet are coupled to the container for causing electrolyte to flow past the electrodes. The anode electrode is downstream from the cathode electrode in one embodiment, such that an electrolyte comprising water is purified by generation of oxygen and/or ozone.

32 Claims, 8 Drawing Sheets

(56) References Cited

U.S. PATENT DOCUMENTS

| | | | |
|---|---|---|---|
| 4,940,015 | A | 7/1990 | Kobashi et al. |
| 5,078,551 | A | 1/1992 | Oomen |
| 5,110,579 | A | 5/1992 | Anthony et al. |
| 5,127,983 | A | 7/1992 | Imai et al. |
| 5,135,730 | A | 8/1992 | Suzuki et al. |
| 5,223,721 | A | 6/1993 | Iida et al. |
| 5,273,731 | A | 12/1993 | Anthony et al. |
| 5,278,431 | A | 1/1994 | Das |
| 5,290,392 | A | 3/1994 | Lau et al. |
| 5,300,188 | A | 4/1994 | Tessmer et al. |
| 5,314,652 | A | 5/1994 | Simpson et al. |
| 5,360,479 | A | 11/1994 | Banholzer et al. |
| 5,387,310 | A | 2/1995 | Shiomi et al. |
| 5,399,247 | A | 3/1995 | Carey et al. |
| 5,404,835 | A | 4/1995 | Yoder |
| 5,419,276 | A | 5/1995 | Anthony et al. |
| 5,443,032 | A | 8/1995 | Vichr et al. |
| 5,474,021 | A | 12/1995 | Tsuno et al. |
| 5,488,350 | A | 1/1996 | Aslam et al. |
| 5,496,596 | A | 3/1996 | Herb et al. |
| 5,540,904 | A | 7/1996 | Bovenkerk et al. |
| 5,551,903 | A | 9/1996 | Kumar et al. |
| 5,587,013 | A | 12/1996 | Ikegaya et al. |
| 5,587,210 | A | 12/1996 | Marchywka et al. |
| 5,589,231 | A | 12/1996 | Hauge et al. |
| 5,592,053 | A | 1/1997 | Fox et al. |
| 5,614,019 | A | 3/1997 | Vichr et al. |
| 5,617,019 | A | 4/1997 | Etter |
| 5,628,824 | A | 5/1997 | Vohra et al. |
| 5,635,258 | A | 6/1997 | Chen et al. |
| 5,653,952 | A | 8/1997 | Suzuki et al. |
| 5,656,827 | A | 8/1997 | Kang et al. |
| 5,670,796 | A | 9/1997 | Nishibayashi et al. |
| 5,704,976 | A | 1/1998 | Snail |
| 5,713,915 | A | 2/1998 | Van Heugten et al. |
| 5,776,323 | A | 7/1998 | Kobashi |
| 5,803,967 | A | 9/1998 | Plano et al. |
| 5,807,433 | A | 9/1998 | Poncelet et al. |
| 5,961,717 | A | 10/1999 | Kamo et al. |
| 6,140,148 | A | 10/2000 | Prins |
| 6,162,412 | A | 12/2000 | Fujimori et al. |
| 6,342,195 | B1 | 1/2002 | Roy et al. |
| 6,433,474 | B1 | 8/2002 | Horiuchi et al. |
| 6,582,513 | B1 | 6/2003 | Linares et al. |
| 6,599,178 | B1 | 7/2003 | Gluche et al. |
| 6,858,080 | B2 | 2/2005 | Linares et al. |
| 6,887,144 | B2 | 5/2005 | D'Evelyn et al. |
| 2003/0131787 | A1 | 7/2003 | Linares et al. |
| 2003/0205190 | A1 | 11/2003 | Linares et al. |
| 2005/0056206 | A1 | 3/2005 | Linares et al. |
| 2005/0056207 | A1 | 3/2005 | Linares et al. |
| 2005/0056208 | A1 | 3/2005 | Linares et al. |
| 2005/0056209 | A1 | 3/2005 | Linares et al. |
| 2005/0061233 | A1 | 3/2005 | Linares et al. |
| 2005/0066884 | A1 | 3/2005 | Linares et al. |
| 2005/0085079 | A1 | 4/2005 | Linares et al. |
| 2005/0109262 | A1 | 5/2005 | Linares et al. |
| 2005/0109264 | A1 | 5/2005 | Linares et al. |
| 2005/0109265 | A1 | 5/2005 | Linares et al. |
| 2005/0109266 | A1 | 5/2005 | Linares et al. |
| 2005/0109267 | A1 | 5/2005 | Linares et al. |
| 2005/0109268 | A1 | 5/2005 | Linares et al. |

FOREIGN PATENT DOCUMENTS

| | | |
|---|---|---|
| EP | 0507497 A1 | 10/1992 |
| EP | 0573943 A1 | 12/1993 |
| EP | 0582397 A2 | 2/1994 |
| EP | 0588260 A2 | 3/1994 |
| EP | 0635584 A1 | 1/1995 |
| EP | 0879904 A1 | 11/1998 |
| EP | 0918100 A1 | 5/1999 |
| GB | 2228949 A1 | 9/1990 |
| JP | 63-093892 | 4/1988 |
| JP | 03-142104 | 6/1991 |
| JP | 10-081590 | 3/1998 |
| WO | WO-01/96633 A1 | 12/2001 |
| WO | WO-01/96634 A1 | 12/2001 |
| WO | WO-2005/090954 | 9/2005 |
| WO | WO-2006/013430 | 2/2006 |
| WO | WO-2006/013430 A1 | 2/2006 |
| WO | WO-2007/126818 A2 | 11/2007 |

OTHER PUBLICATIONS

"Diamond Definition", *Semiconductor OneSource: Semiconductor Glossary*, [online]. [retrieved Sep. 22, 2006]. Retrieved from the Internet: <URL: www.semiconductorglossary.com>, 2 pgs.

"PCT Application No. PCT/US2007/007572", International Search Report mailed Dec. 4, 2007, 7 pgs.

"PCT Application No. PCT/US2007/007572", Written Opinion mailed Dec. 4, 2007, 9 pgs.

"Prosecution File History for U.S. Appl. No. 10/977,267", 50 pgs.

Anthony, J. M., "Ion Beam Characterization of Semiconductors", *In: Semiconductor Characterization: Present Status and Future Needs*, Bullis, W. M., et al., Editors, AIP Press, (1996), 366-376.

Anthony, T. R., et al., "Thermal DIffusivity of Isotropically Enriched $^{12}C$ Diamond", *Physical Review B*, 42(2), (1990), 1104-1111.

Bartels, W. J., "Characterization of Thin Layers on Perfect Crystals with a Multipurpose High Resolution X-ray Diffractometer", *Journal of Vacuum Science & Technology B (Microelectronics Processing and Phenomena)*, 1(2), (Apr.-Jun. 1983), 338-345.

Blakemore, J. S., *Semiconductor Statistics*, Pergamon Press, Inc., New York, NY,(1962), 4 pgs.

Boer, K. W., *Survey of Semiconductor Physics*, New York : Van Nostrand Reinhold,(1990), 29 pgs.

Brunet, F., et al., "Effect of Boron Doping on the Lattice Parameter of Homoepitaxial Diamond Films", *Diamond and Related Materials*, 7(6), (Jun. 1998), 869-873.

Burns, R. C., "Growth of Synthetic Diamond", *The Properties of Natural and Synthetic Diamond*, J.E. Field, Editor, Academic Press, (1992), 396-422.

Chen, Y. C., et al., "Suppression of Defect Propagation in Semiconductors by Pseudomorphic Layers", *J. Applied Physics*, 74(6), (1993), 3800-3804.

Clark, C. D., et al., "Chapter 2—Absorption and Luminescence Spectroscopy", *The Properties of Natural and Synthetic Diamond*, ed. J.E. Field, Academic Press, (1992), 35-79.

Collins, A. T., et al., "Indirect Energy Gap of $^{13}C$ Diamond", *Physical Review Letters*, 65, (1990), 891-894.

Ebert, W., "Epitaxial Diamond Schottky Barrier Diode With On/Off Current Ratios in Excess of $10^7$ at High Temperatures", *Proceeding of IEDM Published by IEEE*, (1994), 419-422.

Eden, R. C., "Chapter 30—Applications of Diamonds in Computers", *Handbook of Industrial Diamonds and Diamond Films*, (1998), 1073-1102.

Field, J. E., et al., "Chapter 18—Appendix: Table Properties", *In: The Properties of Natural and Synthetic Diamond*, Academic Press Inc., San Diego, CA, (1992), 19 pgs.

Findeling-Dufour, C., et al., "Study for Fabricating Large Area Diamond Single-Crystal Layers", *Thin Solid Thins*, 308-309, (1997), 178-185.

Graebner, J. E., "Thermal Measurement Techniques", *Handbook of Industrial Diamond and Diamond Films*, Prelas, M. A., et al., Editors, Marcel Dekker, Inc., (1998), 193-226.

Grovenor, C. R., *Microelectronic Materials*, IOP Publishing, Ltd. (1989), 80 pgs.

Hass, K. C., et al., "Lattice Dynamics and Raman Spectra of Isotopically Mixed Diamond", *Physical Review B (Condensed Matter)*, 45(13), (1992), 7171-7182.

Holloway, H., et al., "Erratum: Isotope Dependence of the Lattice Constant of Diamond", *Physical Review*, B45, (1992), p. 6353.

Hui, P., et al., "Temperature Distribution in a Heat Dissipation System Using a Cylindrical Diamond Heat Spreader on a Copper Heat Sink", *J. Appl. Phys.* 75(2), (Jan. 15, 1994), 748-757.

(56) References Cited

OTHER PUBLICATIONS

Hunn, J. D., "Ion Beam and Laser-Assisted Micromachining of Single-Crystal Diamond", *Solid State Technology*, 37(12), (Dec. 1, 1994), 57-60.

Klemens, P. G., "Thermal Conductivity and Lattice Vibrational Modes", *In: Solid State Physics: Advances in Research and Applications*, vol. 7, Seitz F., et al., Editors, Academic Press, Inc., New York, NY,(1958), 1-98.

Koizumi, S., et al., "Growth and Characterization of Phosphorus Doped n-type Diamond Thin Films", *Diamond and Related Materials*, 7(2-5), (1998), 540-544.

Lang, A. R., "Diffraction and Imaging Studies of Diamond", *The Properties of Natural and Synthetic Diamond*, ed. J.E. Field, Academic Press, (1992), 215-258.

Lang, A. R., "Dilation, Density and Nitrogen Containing Type 1a Diamonds: Previous Work and Proposed Experiments", *J. Phys. D: Applied Physics*, 26, (1993), 2239-2244.

Martin, H. B., et al., "Voltammetry Studies of Single-Crystal and Polycrystalline Diamond Electrodes", *Journal of the Electrochemical Society*,146(8), (1999), 2959-2964.

McCauley, T S., et al., "Homoepotaxial Diamond Film Deposition on a Brilliant Cut Diamond Anvil", *Applied Physics Letters*, 66(12), (1995), 1486-1488.

Nepsha, V. I., "Heat Capacity, Conductivity, and Thermal Coefficient of Expansion", *Handbook of Industrial Diamond and Diamond Films*, Perlas, M.A., et al., Editors, Marcel Dekker, Inc., (1998),147-192.

Perng, K., et al., "Modification on the Band Structure and the Related Emission Characteristics of Defective Diamond Film Doped With Boron", *Applied Surface Science*, 142, (1999), 494-498.

Plano, M A., et al., "Characterization of a Thick Homoepitaxial CVD Diamond Film", *Materials Research Society Symposium, Proceedings*, vol. 339, (1994), 307-312.

Pleskov, Y. V., "New Corrosion-Resistant Electrodes: Synthetic Diamond and Diamond-Based Materials. The Semiconductor and Structure Aspects—a Review", *Protection of Metals*, 42(2), 2006 , 103-118.

Sahli, S. , "Piezoelectric Gauge Factor Measured at Different Fields and Temperatures", *Applications of Diamond Films and Related Materials: Third International Conference*, Feldman, A., et. al. Editors, NIST Special Publications 885, 95-98.

Samlenski, R., et al., "Incorporation of Nitrogen in CHemical Vapor Deposition Diamond", *Applied Physics Letters*, 67(19), (1995), 2798-2800.

Sato, Y., "Synthesis of Diamond From the Vapor Phase", *The Properties of Natural and Synthetic Diamond*, Field, J. E., Editor, Academic Press, (1992), 423-469.

Seal, M. , "High Technology Applications of Diamond", *The Properties of Natural and Synthetic Diamond*, Field, J. E., Editor, Academic Press, (1992), 608-616.

Shiomi, H., et al., "High-Voltage Schotty Diodes on Boron-Doped Diamond Epitaxial Films", *Japanese Journal of Applied Physics part 2 (letters)*; 29(12), (Abstract), (1990), 1 pg.

Sussman, R. S., et al., "CVD Diamond: a New Engineering Material for Thermal. Dielectric and Optical Applications", *Industrial Diamond Review*, 58(578), (1998), 69-77.

Tsao, J. Y., et al., "Critical Stress for $Si_x$-$Ge_{1-x}$ Strained-Layer Plasticity", *Physical Review Letters* 59(21), (1987), 2455-2458.

Voronov, O. A., et al., "Cubic Lattice Parameter of Boron-Doped Diamond", *Extended Abstracts—Electrochemical Society, Spring Meeting*, (1993), p. 760.

"U.S. Appl. No. 10/977,267, Response filed Dec. 30, 2008 to Final Office Action mailed Jul. 1, 2008", 9 pgs.

"U.S. Appl. No. 10/977,267, Final Office Action mailed Nov. 23, 2009", 7 pgs.

"U.S. Appl. No. 10/977,267, Response filed Aug. 21, 2009 to Non Final Office Action mailed Feb. 23, 2009", 9 pgs.

"U.S. Appl. No. 10/977,267, Final Office Action mailed Jul. 1, 2008", 8 pgs.

"U.S. Appl. No. 10/977,267, Non-Final Office Action mailed Feb. 23, 2009", 7 pgs.

"U.S. Appl. No. 10/977,267, Non Final Office Action mailed Jun. 30, 2011", 6 pgs.

"European Application Serial No. 07754141.5, Office Action mailed Jul. 12, 2011", 3 pgs.

"U.S. Appl. No. 09/312,326, Advisory Action mailed Jan. 29, 2002", 3 pgs.

"U.S. Appl. No. 09/312,326, Examiner Interview Summary mailed Jul. 12, 2001", 1 pg.

"U.S. Appl. No. 09/312,326, Final Office Action mailed Jun. 28, 2001", 6 pgs.

"U.S. Appl. No. 09/312,326, Non Final Office Action mailed Feb. 26, 2003", 4 pgs.

"U.S. Appl. No. 09/312,326, Non Final Office Action mailed Jun. 20, 2000", 5 pgs.

"U.S. Appl. No. 09/312,326, Non Final Office Action mailed Dec. 22, 2000", 5 pgs.

"U.S. Appl. No. 09/312,326, Notice of Allowance mailed Mar. 24, 2003", 8 pgs.

"U.S. Appl. No. 09/312,326, Response filed Apr. 20, 2001 to Non Final Office Action mailed Dec. 20, 2000", 2 pgs.

"U.S. Appl. No. 09/312,326, Response filed Aug. 26, 2002 to Advisory Action mailed Jan. 29, 2002", 2 pgs.

"U.S. Appl. No. 09/312,326, Response filed Sep. 20, 2000 to Non Final Office Action mailed Jun. 20, 2000", 8 pgs.

"U.S. Appl. No. 09/312,326, Response filed Oct. 29, 2001 to Final Office Action mailed Jun. 28, 2001", 2 pgs.

"U.S. Appl. No. 10/977,267, Examiner Interview Summary mailed Mar. 20, 2008", 2 pgs.

"U.S. Appl. No. 10/977,267, Response filed Apr. 23, 2010 to Final Office Action mailed Nov. 23, 2009", 7 pgs.

"European Application Serial No. 07754141.5, Response filed Nov. 22, 2011 to Office Action mailed Jul. 12, 2011", 3 pgs.

US 7,189,286, 03/2007, Linares et al. (withdrawn)

\* cited by examiner

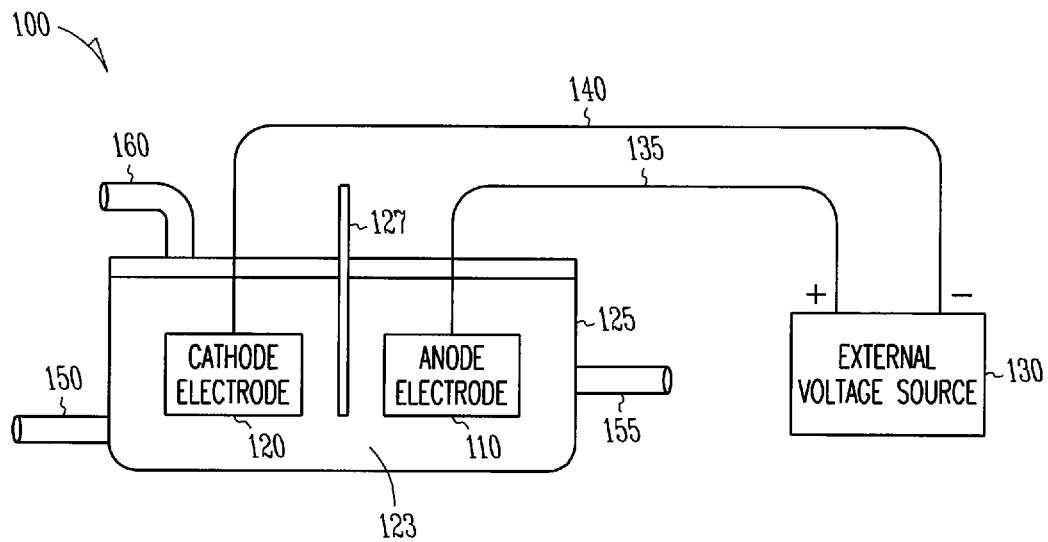
*FIG. 1*
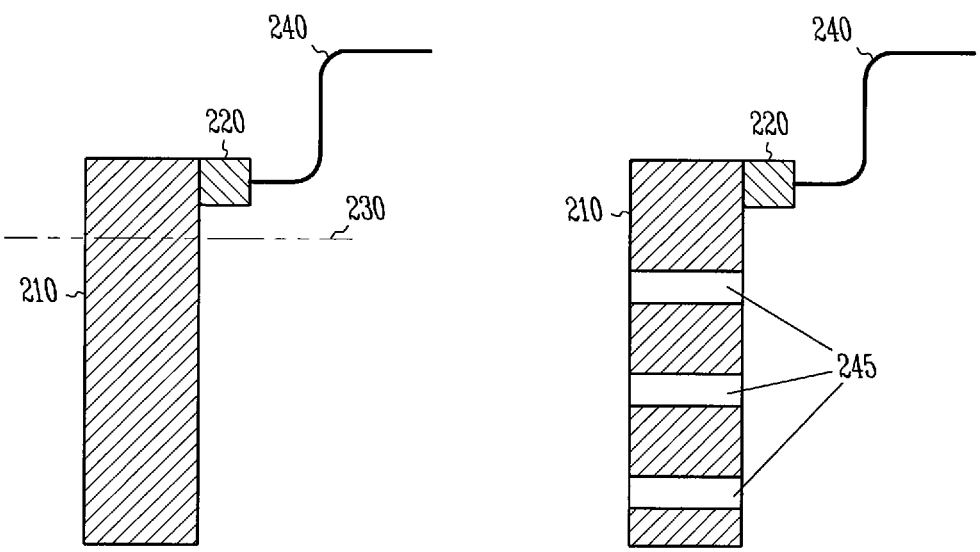
*FIG. 2A*  *FIG. 2B*

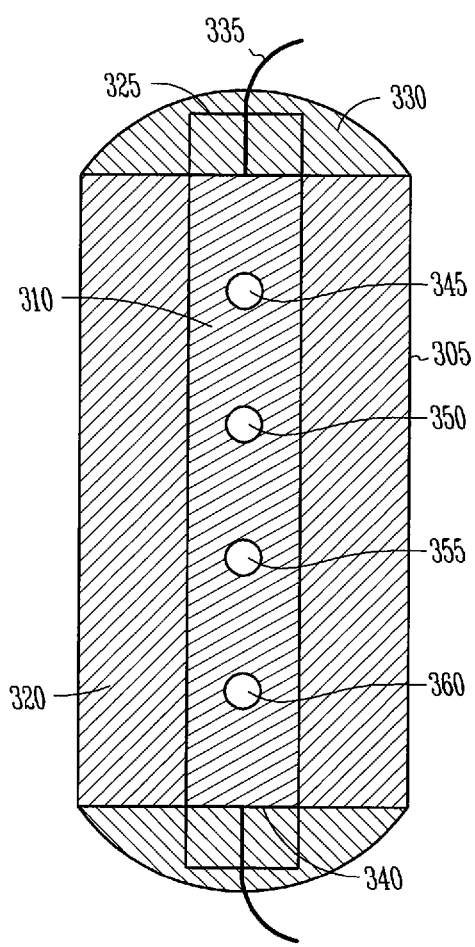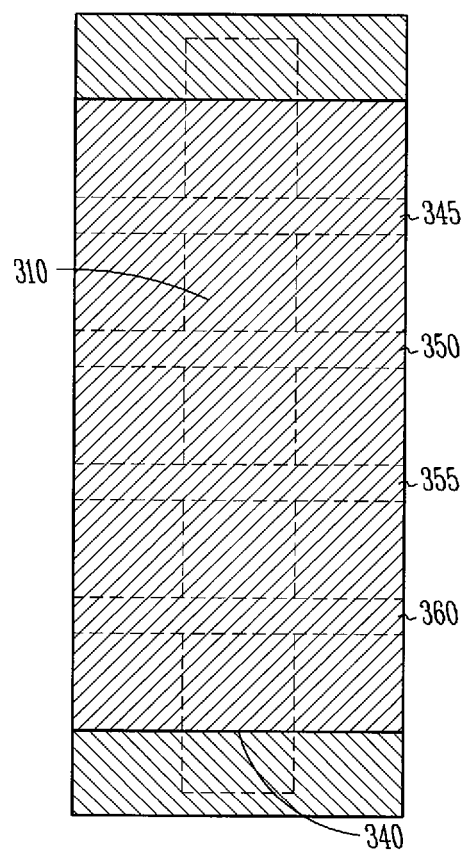
*FIG. 3F*              *FIG. 3G*

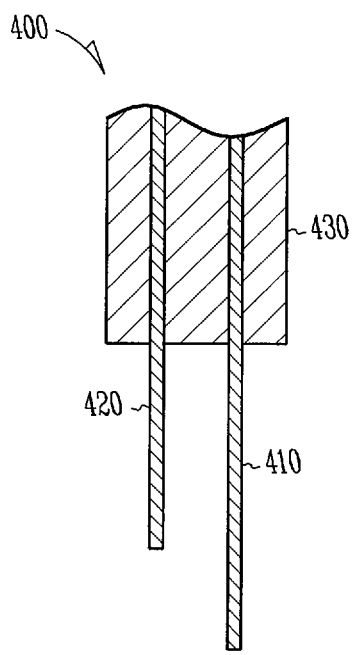
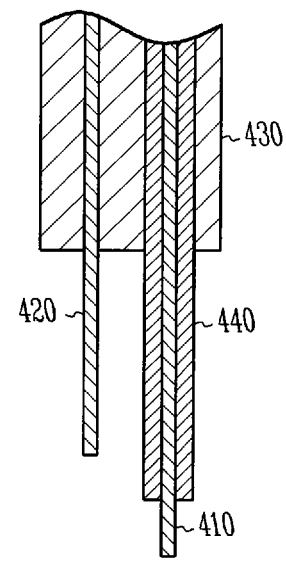
FIG. 4A        FIG. 4B
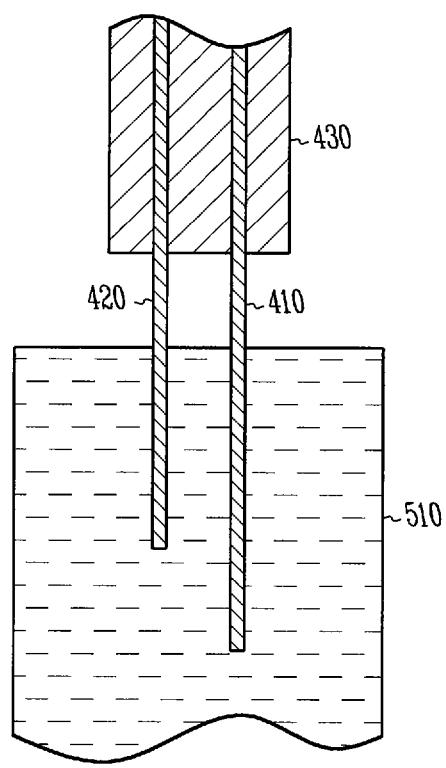
FIG. 5

SINGLE CRYSTAL DIAMOND ELECTROCHEMICAL ELECTRODE

RELATED APPLICATION

This application is a continuation in part of U.S. patent application Ser. No. 10/977,267 filed Oct. 29, 2004, titled "Boron Doped Single Crystal Diamond Electrochemical Synthesis Electrode", which is a divisional of U.S. application Ser. No. 09/312,326, filed May 14, 1999, which issued as U.S. Pat. No. 6,582,513, issued Jun. 24, 2003, which claims priority under 35 U.S.C. 119(e) of U.S. Provisional Patent Application Ser. No. 60/085,542, filed May 15, 1998, the entire disclosure of which is incorporated herein by reference.

FIELD OF THE INVENTION

The present invention relates to electrochemical electrodes, and in particular to a single crystal diamond electrochemical electrode.

BACKGROUND

The use of chlorine or bromine for water purification requires transportation of large volumes of highly toxic material (chlorine and bromine) over large distances from factory to municipality. This transportation is expensive, results in high risk of toxic spills by railway accidents, is costly, and is a security risk. Furthermore it is well known that the use of chlorine and bromine can interact with various organic and inorganic substances in the water being purified to generate carcinogens and other toxic substances. Indeed, chlorine purification is being phased out in many parts of the world in favor of ozonation.

Ozone ($O_3$) or triatomic oxygen is a highly reactive species, which is second only to Fluorine as an oxidative species. Ozone is unstable and will revert to diatomic oxygen ($O_2$) rapidly, with a half-life of 20 to 100 minutes (or average of 30 minutes) that decreases with an increase in temperature or humidity. Ozone can be created by the conversion of $3O_2 \rightarrow 2O_3$ with the addition of energy (in the form of electrons or electromagnetic radiation). This reaction is exothermic and gives off energy in the form of light and heat. Ozone can also be generated by the use of an electric discharge in gas and in liquid by using an electrolytic process.

$O_3$ is a powerful oxidizing agent, which is used commercially for cleaning, disinfecting, deodorizing etc. It is used in applications such as air and water purification and can oxidize many organic compounds. Water purification applications include disinfection, oxidation of heavy metals, control of tastes and odors, improvement of color, breakdown of detergents, pesticides and other organic compounds, ammonia and nitrogen derivatives. Because $O_3$ is so reactive, it is both hazardous and uneconomical to generate at any other place than the point of use. At high levels, ozone is both irritating and toxic.

The use of oxygen has been shown to be as beneficial or better than traditional water disinfectants such as chlorine and bromine, however the electrochemical potential needed to produce oxygen generates an electrical field that enhances the destruction of cellular walls and protective coatings of microorganisms such as bacteria, viruses, cysts, spores, as well as biofilms comprised of microorganisms such as bacteria, viruses, cysts, and spores. Additional benefits of using electronically produced oxygen species for water purification is that oxygen species can be produced on site and in the media to be purified. There are several advantages to producing oxygen on-site. Use of an electric field in the water or other fluid to be purified enhances bacterial kill. Ozone is generated for water purification by passing air over short wavelength ultraviolet light source (such as xenon, argon, mercury or other arc lamp) which generates ozone from the oxygen in the air, which in turn is bubbled through the water to be purified.

Ozone production is a widely used on-site method to purify water but excessive ozone reacts with bromine in the water generating highly carcinogenic bromates. This is bringing about an international water crisis as governments are setting bromate standards which are high, and likely to be unachievable. It may be important to control the amount of ozone delivered to water in order to avoid production of bromates. Another problem with ozone generation is that ozone rapidly recombines with itself to become oxygen again thereby requiring that significantly higher ozone levels be produced to get the required dissolved residual concentration necessary for disinfection of the water. Another method to kill microorganisms in water is to pass water directly over a short wavelength ultraviolet source. This may also be done on-site but may be inefficient because a long residence time is required over the light source to fully disinfect the water.

The use of electrochemical cells to produce oxygen, hydrogen and chlorine is a well established technology. These cells typically use graphite electrodes which significantly erode through attack at the oxygen generating electrode. Previous work has shown that polycrystalline and nanocrystalline boron doped diamond has a significantly lower erosion rate than graphite but eventually fails due to attack at the grain boundaries of the polycrystalline diamond. At such junctions, both sp2 graphitic diamond and other impurities, such as boron, will preferentially accumulate. Grain boundaries will have altered electrochemical properties which impede normal conductivity and reduce the efficiency of the electrodes. The lower resistivity of sp2 diamond and higher current density of boron at regions of accumulation result in preferential attack of these regions. Further, in high grade polycrystalline, high dislocation levels and crystal defects concentrate regions of boron that are susceptible to erosion. Reports of erosion of polycrystalline diamond occurs at current densities of only 0.5 to 2.5 amps per square centimeter. Such electrodes have significantly longer lifetimes than prior materials, but undergo catastrophic failure during operation.

SUMMARY

A conductively doped single crystal diamond provides a desired material for electrochemical electrodes. In one embodiment, the diamond is used to produce oxygen and/or ozone, and is highly resistant to oxidation and failure.

In one embodiment, the diamond is formed using chemical vapor deposition in the presence of diborane to obtain a boron doped single crystal diamond plate. The doping levels may be in the range of $10^{17}$ to $10^{20}$ atoms/cc or higher to provide a conductive electrode. Such an electrode may be used for long periods in electrochemical reactions without significant wear.

Conductive single crystal diamond electrodes may be made in a variety of shapes and sizes, allowing use of such electrodes to produce ozone at the point of use. Examples of such electrodes include large electrodes for municipal water purification, on site purification of bottled water, and surgical applications, where the electrode is shaped to facilitate ozone production in a surgical site in a body.

In one embodiment, the electrode is able to withstand several orders of magnitude higher current than polycrystalline diamond. In one embodiment, the electrodes have minimal grain boundaries.

BRIEF DESCRIPTION OF THE DRAWINGS

FIG. 1 is a block diagram of a system for producing ozone from water by electrochemical reactions using a conductive single crystal diamond electrode according to an example embodiment.

FIGS. 2A and 2B are cross sections of conductive single crystal diamond electrodes according to example embodiments.

FIGS. 3A, 3B, 3C, 3D, 3E, 3F, 3G, 3H and 3I are cross sections or side views illustrating formation of alternative electrodes according to various example embodiments.

FIGS. 4A and 4B are cross section representations of a set of electrodes for producing ozone at a point of use according to example embodiments.

FIG. 5 is a cross section representation of a set of electrodes for producing ozone in a bottle containing water for purifying water in the bottle according to an example embodiment.

DETAILED DESCRIPTION

Figure 3A:
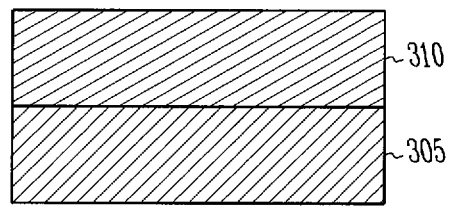

In the following description, reference is made to the accompanying drawings that form a part hereof, and in which is shown by way of illustration specific embodiments that may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

FIG. 1 is a block diagram of an electrochemical system generally at 100. The system facilitates oxidation and reduction reactions which produce or consume electrons. These reactions take place at electrode/solution interfaces, where an anode electrode 110 and a cathode electrode 120 are good electrical conductors. In all subsequent figures, the anode represents the diamond electrode, which is +, and where O2 is generated. The cathode is the electrode with a − charge, which produces H+, and can be made with various materials. In operation, the electrodes are connected to an external load or to an external voltage source 130, via electrical leads 135 and 140, and electric charge is transferred by electrons between anode electrode 110 and cathode electrode 120 through the external circuit. To complete the electric circuit through the system an electrolyte 123 is contained within a cell 125 provides an additional mechanism for internal charge transfer. The electrolytes or naturally occuning impurities support charge transfer by ionic conduction. Electrolytes are generally poor electronic conductors to prevent internal short circuiting of the cell 125. In the case of water as the electrolyte, oxygen, ozone and other active byproducts are produced at the anode and hydrogen at the cathode. In a simple form, the following reactions occur at or near the electrode:

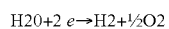

The ozone acts to purify the water. The same principle applies to other elements, such as Br and Cl, by providing these elements in the electrolyte.

The simplest electrochemical system or cell consists of at least two electrodes and one or more electrolytes. The electrode at which the electron producing oxidation reaction occurs is the anode 110. The electrode at which an electron consuming reduction reaction occurs is called the cathode 120. The direction of the electron flow in the external circuit is from the anode to cathode, leading to an oxidation environment at the cathode. A baffle 127 may be placed between the anode 110 and cathode 120. The baffle 127 helps separate the reactions occurring at the different electrodes. In one embodiment, the baffle is porous, allowing electrolyte to flow through it. The membrane serves to separate the products produced at the anode and cathode, yet to allow free movement of electrons between the two sides.

In order to drive the electrolysis reactions, electric power is applied to the cell electrodes. The electrodes 110, 120 are connected through the electrical leads 135, 140 to the source of electric power 130 with the polarity being selected to induce the electrolyte anion flow to the anode 110 and the cation flow to the cathode 120. In electrolysis, ozone production can be accurately metered by regulating electrical current to provide control of the dose required, such as to minimize production of bromates. Furthermore, pH of the water being purified can be altered by addition of CO2 to make it slightly acidic.

The cell 125 may be provided with appropriate plumbing and external structures to permit circulation of the electrolyte, or in the case of water purification, an inlet 150 for water to be purified, and an outlet 155 for purified water. Suitable inlet and outlet passages may also be provided in the cell head space to permit the withdrawal of the gases evolved from the cathode (if gases are to be evolved) and from the anode. A gas outlet 160 proximate cathode 120 may be used to collect hydrogen when the electrolyte comprises water. The hydrogen may be purified, such as by use of a palladium filter, and/or used in a fuel cell or combustion based generator to augment the power supply. In one embodiment, the hydrogen in the form of H+ may be dried prior to use. The power supply may be solar or wind power based to facilitate water purification in remote areas without access to a power grid or other fixed electrical source.

In one embodiment, the anode 110, which has the positive charge, is formed of conductively doped single crystal diamond. The single crystal diamond is in the highest oxidation state, or kinetically resistant to oxidation. It is also conductive to provide current densities to obtain sufficient anodic potentials for ozone production. Boron may be used as a dopant during formation of the single crystal diamond during a plasma assisted chemical vapor deposition (CVD) of the single crystal diamond. Such boron doped single crystal diamond anodes have been observed to operate 500 to 1000 hours with no detected evidence of erosion at current densities of up to 3000 amps/cm2. Other dopants, such as phosphorous or other N type dopants may also be used.

In a further embodiment, cathode 120 is also formed of conductively doped single crystal diamond. Since it is not subjected to as harsh an environment as anode 110, it may be formed of other conductive materials, such as polycrystalline doped diamond, or many different kinds of materials, including metals. Some materials include, but are not limited to conventional electrode materials such as graphite or platinum.

FIG. 2A is a block diagram of a single crystal conductively doped electrode 210 having a metal contact 220 formed thereon. In one embodiment, the metal contact is formed by evaporating a selected metal directly onto one end of the electrode 210. Suitable metals for such contacts include gold, aluminum, titanium and others. In one embodiment, the other end of the electrode is submersed during use in an electrolytic cell, while the end with the metal contact is located outside of the electrolyte, as indicated by electrolyte level line 230. A conductor 240 may be coupled to the metal contact for coupling to a supply. It should be noted that other types of conductive materials may be used for the contact, and that the contact may be formed in many different manners. It should provide suitable electrical coupling to the single crystal diamond electrode.

In one embodiment, the single crystal diamond electrode is substantially rectangular in shape, and fairly thin. The actual shape may depend on the desired use of the electrode and practical limits in the size of single crystal diamonds that can be formed. Large scale commercial water purification plants may utilize very large electrodes, while ozone production applications, such as surgical and consumer applications may utilize much smaller electrodes. The electrodes may also be formed with various affects to increase surface area, such as by having one or more holes 245 formed in or through conductively doped electrode 210 as shown in FIG. 2B, ridges, valleys, or other surface area enhancing features.

Figure 3B:
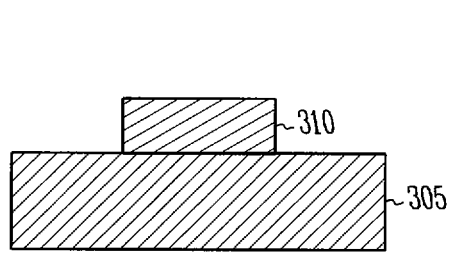
Figure 3C:
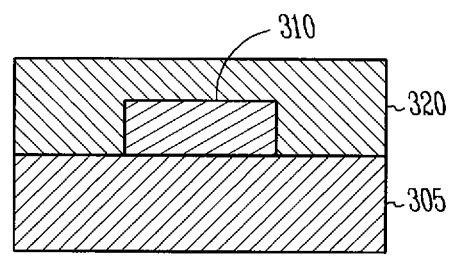

FIGS. 3A through 3E are cross sections illustrating formation of alternative electrodes. FIG. 3A shows a CVD grown single crystal diamond layer 305 with no or minimal conductive doping. A next layer of CVD grown conductively doped single crystal diamond 310 is formed on the layer 305. This layer is then etched or otherwise shaped as shown in FIG. 3B to form a conductive portion 310 of an electrode. A next non-conductive layer 320 of CVD grown diamond is then formed on top of the conductive portion 310 as shown in FIG. 3C. The non-conductive layers act as a passivation layer that does not significantly erode. In further embodiments, a polycrystalline diamond may act as a passivation layer.

Figure 3D:
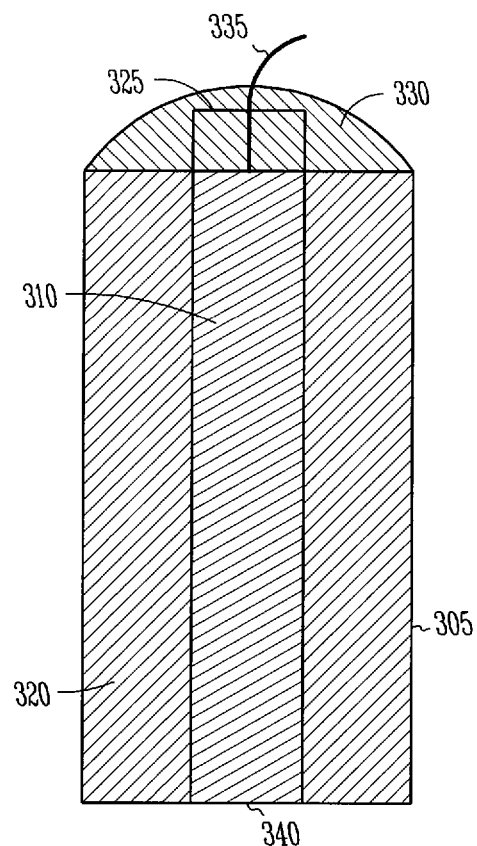
Figure 3E:
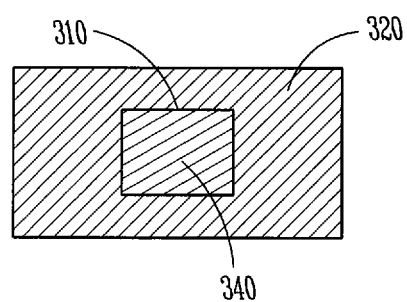

FIG. 3D, and end view FIG. 3E illustrate a completed electrode. A contact 325 is formed on a first end of the conductive portion 310. The contact may be formed of any type of conductive material, such as many different types of metal. An insulator 330 is then formed over the contact, such that the conductive portion 310 at the first end is not exposed to electrolyte when the finished electrode is immersed in the electrolyte. In one embodiment, the insulator is plastic. Many other types of insulators may be used, such as epoxy, or even plumbers gooup. An electrical conductor 335 such as a wire, is also attached to the contact 325. The electrical conductor 335 may be insulated to prevent interaction with the electrolyte.

At least a portion of the conductively doped single crystal diamond portion 310 is exposed to the electrolyte as indicated at 340. This point is where the reaction with the electrolyte, such as water, produces ozone when acting as a cathode. It is also a highly corrosive environment. However, the insulative single crystal diamond surrounding the conductive portion 310 prevents erosion by creating a buffer zone between parts of the electrode that may be eroded more quickly, such as the point at which the conductor 335 and contact 325 are attached to the conductive portion 310. The insulative layer 330 also provides protection from erosion.

FIG. 3F and side view FIG. 3G illustrate an alternative embodiment designed to provide greater exposure of the conductive portion 310 to the electrolyte. Holes may be formed through the non-conductive and conductive layer single crystal diamond as indicated at 345, 350, 355 and 360. While only four such holes are shown, there may be many more in further embodiments, and they may be formed during construction of the electrode, or by laser, machining or other means following formation of the electrode. This creates a porous membrane for water to flow through. Such an electrode may be positioned transverse within a channel or pipe, such that all water flows through the membrane. The cross section of the channel or pipe may also match the cross section of the membrane, ensuring flow through the membrane and maximum exposure of the water to the ozone producing conductive portion of single crystal diamond 310. In a further embodiment, also illustrated in FIG. 3E, a portion 365 of the conductive portion 310 may have the non-conductive single crystal diamond etched away, exposing a greater portion of the conductive portion 310 to the electrolyte.

Figure 3I:
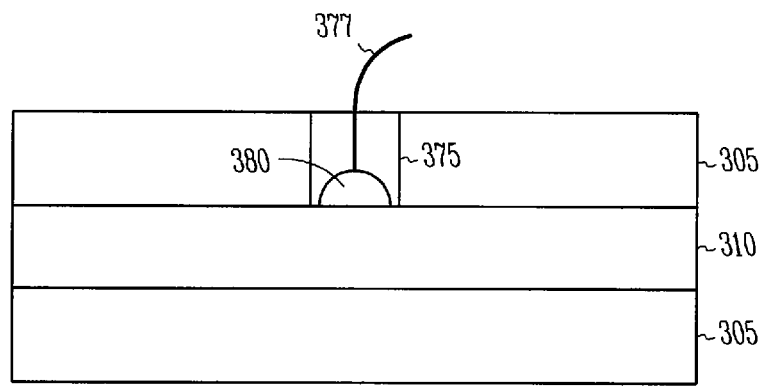
Figure 3H:
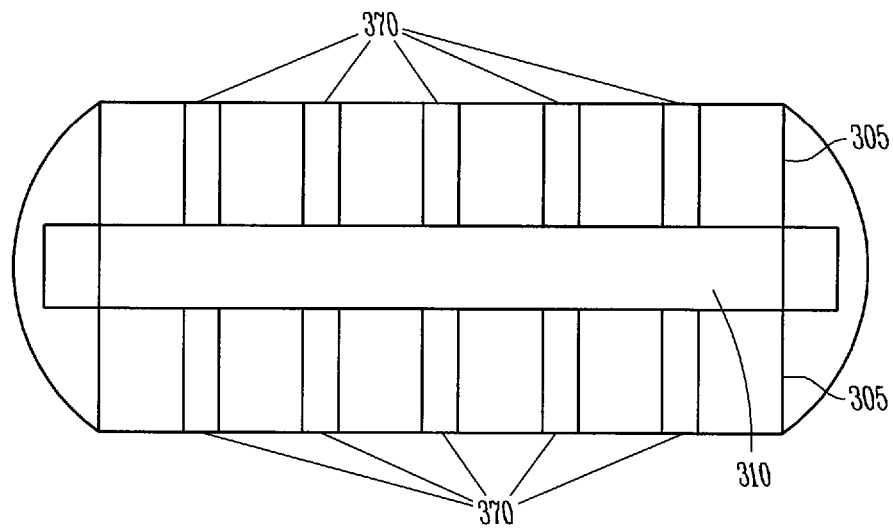

In further embodiments, holes 370 may penetrate only to the conductive layer, as illustrated in cross section in FIG. 3H and need not transgress the conductive layer. Contact of the conductive diamond layer 310 to a voltage supply may be made by wire 335 as shown on a side or end of the structure, or may be made through one of the holes. Conductors may also be provided within selected holes 370 with appropriate insulation. The conductive diamond layer 310 may then be exposed in as many places on the edges as practicable to create oxygen when properly driven via the conductor or conductors. In one embodiment, alternate holes 370 may contain conductor, while the other holes provide access of the conductive diamond layer to electrolyte.

In one embodiment as shown in FIG. 3I, a hole 375 is formed through non-conducting layer 305 to contact conducting layer 310. A conductor 377 is connected to the conducting layer 310 in the hole and secured thereto by metalization 380 or by other means. An insulator may fill the hole to protect the wire from the oxidizing environment. The conducting layer may be exposed to electrolyte on all edges such that contact is made on all edges. It may be thought of as a sandwich, with the edges of the sandwich filling exposed. In one embodiment, the layers are circular in shape. In further embodiments, the layers may be rectangular or polygonal. Additional holes through the non conducting layers may be provided to further increase the amount of conducting diamond layer exposed to electrolyte. Some of the holes may also traverse the conducting diamond layer in further embodiments.

In one example method of making the porous electrode, a boron doped single crystal diamond 210 is masked with photoresist to block off holes. The holes are filled with SiO2 and the photoresist is removed. Ion implantation is used for separation. Boron doped single crystal diamond is then grown and the SiO2 is etched out. The grown layer is then separated where the ions are implanted. The separated grown layer comprises an electrode 320 with holes in it.

In one embodiment, the single crystal diamond electrode is doped with boron atoms at levels from $10^{17}$ to $10^{22}$ atoms/cc. Boron doping at high levels may be obtained in one embodiment by progressive doping of diamond using lift off techniques. In other words, a layer of diamond is grown on an existing layer or seed of diamond. Prior to growing the layer, a shallow implantation is formed to facilitate a lift off of the new layer to be grown. The new grown layer has a higher level of doping than the layer it is formed on. The new grown layer is lifted off. It forms the seed layer for a next grown layer having a higher level of doping. Successively higher doped layers are formed in the same manner to avoid deformation of the grown layers of diamond by having adjacent layers with lower lattice mismatch. Once a seed layer of at or near the desired doping is obtained, it may be repeatedly used with lift off techniques to produce multiple highly doped single crystalline diamond electrodes.

The doping levels in the $10^{17}$ to $10^{22}$ atoms/cc range provide a high conductivity level for the electrodes. When combined with the resistance of such electrodes to oxidation, current densities of beyond 1000 amps/sq cm may be obtained. This is several orders of magnitude higher than doped polycrystalline diamond electrodes, which show significant damage at much lower current densities, such as 0.5 to 5 amps/sq cm.

However, high current levels can lead to boiling of the electrolyte because of resultant exothermic reactions. Such boiling can create voids about the electrodes, leading to less contact with the electrolyte. Further, the higher the temperature of the solution, the more rapid the turnover of the ozone. In some embodiments, the current levels may be reduced to minimize boiling of the electrolyte, or the electrolyte may be stirred, or otherwise moved past the electrode at a faster rate, to minimize the effect of higher currents.

FIG. 4 is a block diagram of an oxygen/ozone producing device indicated generally at 400. An anode 410 comprising conductively doped single crystal diamond and a cathode 420 are supported by a narrow sleeve 430. Conductors extend from the anode and cathode to a suitable power supply. In one embodiment, separation of the anode and cathode is provided by making the anode longer than the cathode. The sleeve is narrow enough to be inserted into a neck of a bottle. Separation of the anode and cathode may also be provided by a baffle 440 as shown in FIG. 4B, provided between the anode and cathode, or the baffle may surround the cathode. In further embodiments, element 440 comprises an insulating cylinder, such as glass, quartz, alumina, etc., to mask part of the length of the anode. In one embodiment, element 440 extends deeper than the other electrode to provide some separation. Element 440 may be used on either of the electrodes if desired. In still further embodiments, element 440 may be formed of a polymer, such as polytetrafluoroethylene.

FIG. 5 shows use of the device 400 to produce oxygen/ozone at a point of use, such as bottle 510. Device 400 may be inserted into the bottle while the bottle is being filled, and produce oxygen/ozone in real time. The device 400 may then be withdrawn from the bottle, leaving oxygen/ozone in the fluid, such as water in the bottle that continues to purify the water. The production of oxygen/ozone at the point of use avoids costs, difficulties and hazards of transporting ozone/oxygen from a generation site to the point of use.

Device 400 may also be used to produce ozone in an open wound on a patient for wound or surgical sterilization purposes. The electrodes made of single crystal conductively doped diamond may be made as shown in FIGS. 2A-2B and 3A-3G.

Figure 6:
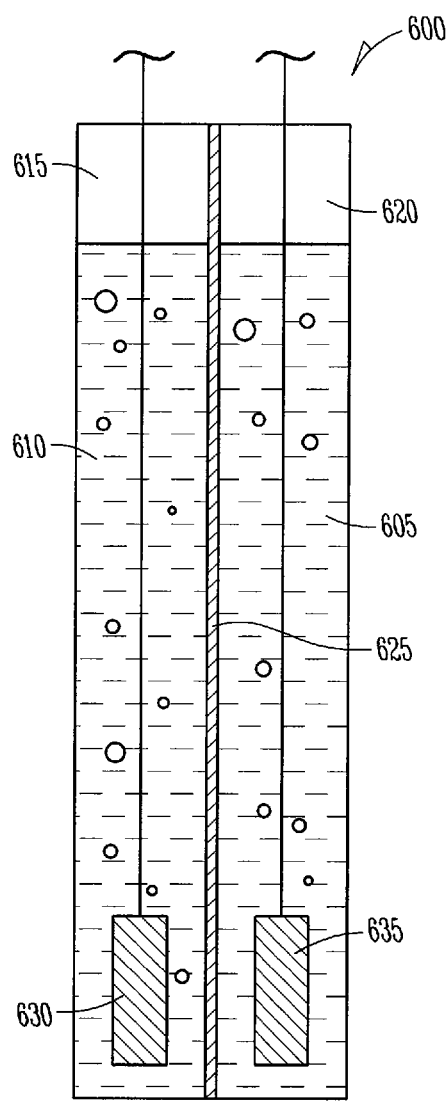
FIG. 6 is a block diagram of a vertical system divided into two columns separated by a membrane, with oxygen generation on the one side and hydrogen on the other, according to an example embodiment.
Figure 7:
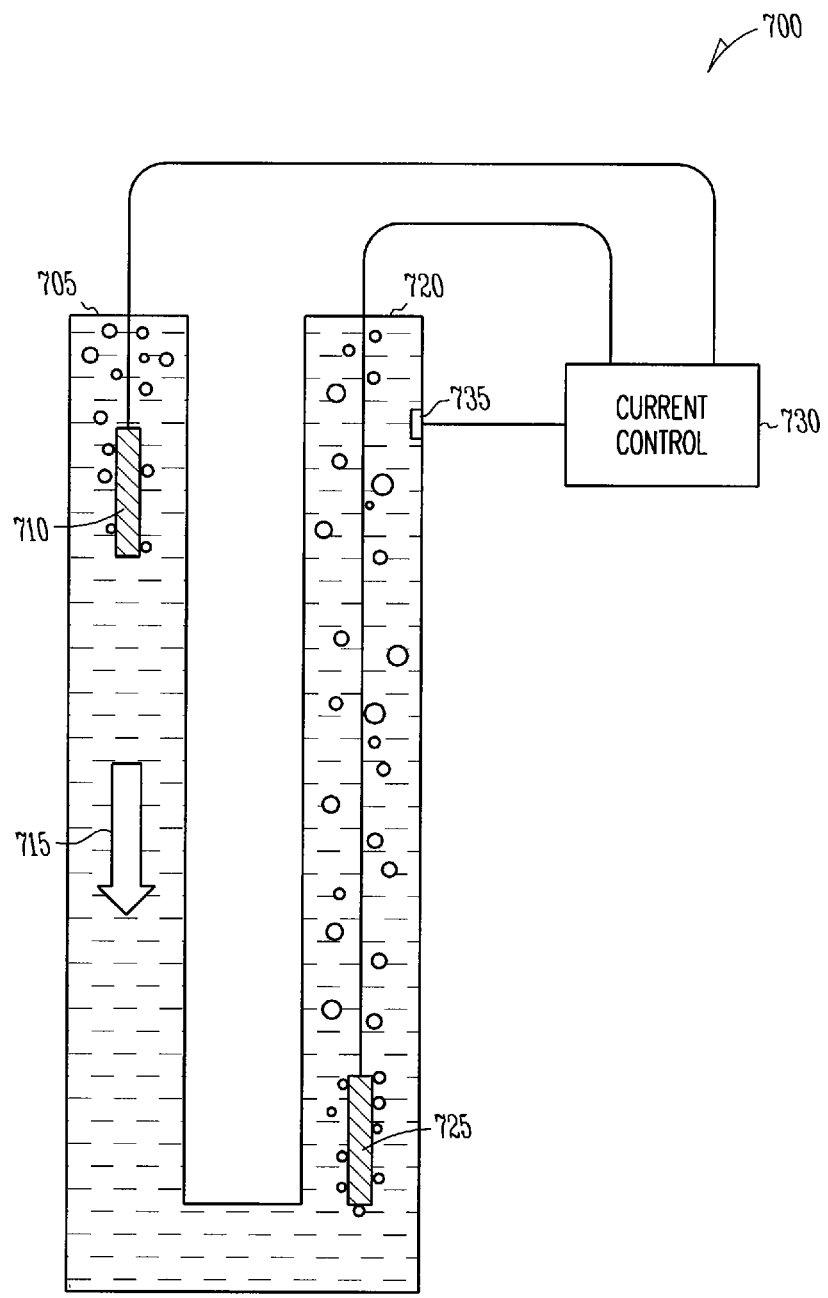
FIG. 7 is a block diagram of a U shaped system, with water entry at one top of the U according to an example embodiment.

FIGS. 6 and 7 shows two types of systems that electrodes can be used in. Electrodes may be separated by a membrane that allows electron flow but not ions. Hydrogen ions may be collected and put into a fuel cell. FIG. 6 is a block diagram of a vertical system 600 divided into two columns 605 and 610, with oxygen generation 615 on the left side and hydrogen 620 on the other. The two columns are separated by the membrane 625. A Cathode 630 is disposed in column 610, and an anode 635 is disposed in column 605. In one embodiment, at least cathode 630 is formed of single crystalline diamond. Water may come in from the bottom of the columns 610, 615. Ozone exits the top of the left column 610, and hydrogen that is produced in the right column 615 is pumped back to re-enter with the water.

FIG. 7 is a block diagram of a U shaped system 700, with water entry at a top left 705 of the U. A hydrogen producing electrode 710 sits at the top left of the U (where water entry occurs). As the water travels down the U as indicated by an arrow 715, the stream of hydrogen bubbles floats upward against the direction of the water to exit the system 700. As the water starts up the right side 720 of the U, it encounters an oxygen producing electrode 725 where oxygen and ozone bubbles are generated, which conveniently, also propels the water up the tube. As the water flows past the electrode out of the U, it carries the produced ozone with it. Water can be added to the system along the ascending side of the tube to treat additional water. In one embodiment, a controller 730 is coupled to an ozone sensor 735. The ozone sensor is situated proximate to or downstream from the electrodes in one embodiment to sense the amount of ozone in the water being purified. The controller may have a desired set point or threshold for controlling current to the electrodes based on the sensed ozone.

In a further embodiment, system 700 may comprises a water feed for a water bottling line. The sensor 735 may be located near an exit of the system, close to the bottles being filled such that it senses water in the bottle. In a further embodiment, the sensor 735 may extend into the bottle, and the system may be a straight tube that can be inserted into the bottle. In this embodiment, the water may flow past the electrodes in a straight or substantially straight line. The velocity of the water may be fast enough to prevent bubbling at the cathode 725 when larger currents are used, which can be supported by single crystal diamond electrodes. This allows a larger amount of water per second to be treated. Electrical conduction between the electrodes is not significantly affected by the speed of the water flowing through the system.

Single Crystal Diamond Electrode Fabrication

In one embodiment a synthetic monocrystalline diamond composition comprises one or more monocrystalline diamond layers formed by chemical vapor deposition, the layers including one or more layers having an increased concentration of one or more impurities to increase conductivity, such as boron. Such a composition, provides an improved unique combination of properties, including color, strength, velocity of sound, electrical conductivity, and control of defects.

By "doped", as used herein, it is meant that at least one layer within a composition of this invention has been grown with an amount of one or more impurities, e.g., incorporated into the gas stream, in order to bring about an amount of an impurity, such as boron, phosphorous, sulfur, carbon isotopes, or lithium in the synthetic monocrystal layer, sufficient to produce a measurable change in the electrical, physical, optical, electronic or crystallographic properties.

A variety of structures can be built from monocrystalline diamond, e.g., one composed of layers containing different concentrations of impurities, as well as methods that employ such structures. New uses for semiconducting monocrystalline diamond made by the addition of impurity-doped layers, as well as methods for using and methods for producing monocrystalline diamond crystals with improved optical and electrical properties, and methods for using both undoped and doped monocrystalline diamond plates.

Electrodes made of single crystal boron doped diamond have no grain boundaries and have life times which are significantly longer than polycrystalline diamond and show uniform wear, but no catastrophic failure. Moreover, single crystal diamond electrodes can withstand several orders of magnitude higher current than polycrystalline diamond without catastrophic failure or measurable erosion.

Single diamonds or individual layers can be made with room temperature electrical resistivity ranging from about 100,000 $\Omega$-cm to <0.001 $\Omega$-cm, and preferably from about 5000 $\Omega$-cm to less than 0.001 $\Omega$-cm, by adding boron to the precursor gas to yield boron concentrations ranging from about 0.005 ppma to about 10,000 ppma (and preferably from about 0.01 ppma to about 3000 ppma) in the diamond. Such boron doped layers can also be grown in conjunction with isotopically enriched layers in order to create layer junctions which have band gap discontinuities. For example, a boron-doped $^{13}$C enriched layer on a natural isotope undoped layer creates a doped layer with a wider band gap than the undoped layer. Such a layer can be expected to yield enhanced electrical properties relative to a structure with no band gap discontinuity.

Various technologies that can be employed for diamond formation in other examples, including microwave plasma reactors, hot filament reactors, DC plasma reactors, RF plasma reactors, and other such technologies. The formation of synthetic diamond can be achieved through a variety of methods and apparatus, such as that described in U.S. Pat. No. 6,582,513, titled "System and Method for Producing Synthetic Diamond", which is incorporated by reference.

The diamond grown in one example is a monocrystalline synthetic diamond with a stream of gas, such as methane or other gas, providing the precursor material for the plasma reactor to produce a plasma that precipitates to form diamond. The gas in some examples or in some layers of the diamond contains various impurities, such as boron dopants or various isotopes of carbon. For example, diamonds having a greater than average purity of carbon-12 and a corresponding reduced concentration of carbon-13 isotopes are known as isotopically enhanced, and are particularly thermally conductive. This makes them well-suited for applications such as semiconductor device fabrication, enabling higher power and higher density than can otherwise be achieved. Isotopic enhancement of the diamond CVD precursor gases with carbon-12 can result in a diamond having significantly less than the typical 1.1% carbon-13 concentration, resulting in thermal conductivity as high as 3300 W/mK. Other examples of methods of producing synthetic diamond with high thermal conductivity include growing diamond in a low nitrogen environment, growing synthetic diamond in an environment rich in hydrogen, and using boron doping resulting in an increase in thermal conductivity.

In some embodiments, diamond regions having boron or other dopants implanted will have somewhat larger or smaller lattice structures than undoped diamond as a result of placement of the dopant within the diamond crystal structure. The lattice mismatch between diamonds having different doping concentrations or between doped and undoped diamonds is controlled in some embodiments by implantation of ions selected to give the desired lattice structure. For example, a lightly boron-doped diamond region will have a lattice structure somewhat expanded relative to undoped diamond made from primarily carbon-12. Adding carbon-13 to the boron-doped diamond shrinks the lattice structure, and is used in some embodiments to eliminate the lattice mismatch between diamond layers or to control the lattice mismatch or strain between diamond layers, as described in U.S. Pat. No. 6,582,513, which is incorporated herein by reference.

In further embodiments, an outer layer with controlled stress may further reduce erosion. A thin layer with a higher boron concentration may be used to provide such a layer in one embodiment.

EXAMPLE 1

Growth of (100) Oriented Boron Doped Single Crystal Diamond on Type IB High Pressure Synthetic Diamond Using the Hot Filament Method A high pressure synthetic type lb diamond single crystal is ground and polished to yield a substrate with a (100) orientation. The substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 1000° C. as measured by a disappearing filament optical pyrometer. After stabilizing the temperature of the filament and substrate for five minutes acetone vapor is added to the gas stream so that the final mixture is 99% hydrogen and 1% acetone containing 1000 parts per million of methyl borate while maintaining the total gas flow at 100 sccm. Part of the hydrogen is converted to atomic hydrogen on the surface of the filament and the acetone decomposes in the presence of the atomic hydrogen on the substrate surface to form an epitaxial layer of diamond. Growth is maintained for 12 minutes at a rate of 1 micrometer per hour to form a boron doped single crystal deposit of 0.2 micrometers thick. At the end of this time period the acetone flow is terminated, the filament power and substrate power are terminated and the substrate with film is cooled to room temperature. At this point, the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface. After cleaning the substrate with the attached single crystal boron doped film diamond are mounted in a van der Pauw test system to measure the resistivity and mobility.

A boron doped single crystal film of diamond having a (100) is grown having a thickness of approximately 1 μm and is attached to a single crystal diamond substrate. In further embodiments, layers of significantly different thicknesses may be grown. Some layers were grown with thicknesses between 0.1 um and 10 um. A layer 0.2 um may also be grown. Thinner and thicker layers may also be grown using this process.

EXAMPLE 2

Growth of a (100) Oriented Boron and $^{13}$C Codoped Single Crystal Diamond Film on a CVD Grown Single Crystal Synthetic Diamond Using the Hot Filament Method A polished CVD grown diamond single crystal having a (100) orientation is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas which has been enriched with respect to $^{13}C$ and diborane is added to the gas stream so that the final mixture is 99% hydrogen and 1% $^{13}C$ methane containing 100 ppm of diborane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 10 minutes hours at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a boron doped single crystal $^{13}C$ diamond film attached to a $^{12}C$ single crystal diamond seed.

A boron and $^{13}C$ doped single crystal diamond film is grown attached to a CVD single crystal diamond substrate wherein the film has a (100) orientation and a thickness of approximately 0.17 μm.

EXAMPLE 3

Growth of a (100) Oriented Phosphorous and $^{13}C$ Codoped Single Crystal Diamond Film on a CVD Grown Single Crystal Synthetic Diamond Using the Hot Filament Method A polished CVD grown diamond single crystal having a (100) orientation is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas which has been enriched with respect to $^{13}C$ and phosphene is added to the gas stream so that the final mixture is 99% hydrogen and 1% $^{13}C$ methane containing 100 ppm of phosphene while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 10 minutes hours at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a phosphorous doped single crystal $^{13}C$ diamond film attached to a $^{12}C$ single crystal diamond seed.

A phosphorous and $^{13}C$ co doped single crystal diamond film is formed on a CVD single crystal diamond substrate having a (100) orientation, wherein the film is also (100) orientation and has a thickness of approximately 0.17 μm.

In further embodiments, a (111) orientation may be formed, and the doped single crystal diamond layers in various embodiment may be increased in thickness by increasing the growth times.

EXAMPLE 4

Growth of a Structure Having a Boron Doped Single Crystal Diamond Layer Followed by an Undoped Single Crystal Diamond Layer on a CVD Grown Single Crystal Synthetic Diamond Using the Hot Filament Method A polished CVD grown diamond single crystal having a (100) orientation and a thickness of 75 micrometers is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm. Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas and diborane is added to the gas stream so that the final mixture is 99% hydrogen and 1% methane containing 1000 ppm of diborane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 15 minutes hours at a rate of 1 micrometer per hour to form a single crystal deposit of 0.25 micrometers thick. At the end of this time, the diborane flow is terminated, and the methane flow continued for an additional 75 hours. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a boron doped single crystal diamond layer imbedded in a 150 micrometer thick single diamond crystal.

A (100) oriented single crystal diamond structure is formed having a 75 μm thick undoped CVD diamond followed by a 0.25 μm thick boron doped single crystal diamond layer, followed by a 75 μm thick CVD single crystal diamond layer.

In various embodiments, the amount of methane used may be varied, such as between approximate 1 to 2%. In further embodiments, even higher levels of methane may be used. The substrate temperature may be in the range of approximately 950° C. to 1300° C. Other substrate temperatures may also be used as desired. Further, different methods of creating the plasma may be used, such as RF plasma, or other methods. Any method may be used to create single crystal diamond, which may be shaped into electrodes.

Electrode Shaping

Many different methods may be used to shape the electrodes. In one embodiment, a seed in the form of the desired shape and size of the electrode is used to grow a new electrode. The seed may be reused. In further embodiments, electrodes may be cut or otherwise separated from larger grown diamond. One method of separating desired shapes of electrodes from a larger crystal involved selective or masked ion implants to lift off the electrodes.

In one embodiment, patterned ion implantation is employed to deliver one or more atomic species, such as hydrogen or carbon into and beneath the diamond growth surface in order to form an implanted layer with a peak concentration of atoms at a predetermined depth beneath the diamond growth surface. The composition is heated in a non-oxidizing environment under suitable conditions to cause separation of the synthetic diamond structure. Some implants may be used in conjunction with etching or oxidation to cause desired separations. Low temperature implants and electrolysis may also be used. Electrodes of desired thickness may be formed in this manner and then further cut using conventional techniques, such as laser or sawing to form a desired shape and size of electrode.

Such a non-oxidizing atmosphere generally includes any atmosphere not containing a sufficient concentration of oxygen so as to be reactive through oxidation. Examples of such atmospheres include inert (e.g., helium, neon, argon, etc.) and other non-oxygen containing gases (e.g., hydrogen, nitrogen, etc.). Environments used to provide such atmospheres can include plasmas, vacuums, and the like.

In certain embodiments of the invention, various initial steps can be performed prior to or concurrent with the ion implantation stage. One such step involves choosing a substrate. When growing single crystalline CVD diamond, for instance, such substrate may be a single crystalline diamond.

Upon selection of the substrate, at least one major surface of the substrate can be identified, and optionally prepared, for ion implantation. Preparation of the diamond surface can include any suitable means for affecting the chemical and/or physical make-up of the surface, for instance, by polishing using conventional polishing methods. Preparation of this sort can be accomplished in advance of the ion implantation. Typically, ions are implanted in a manner at a set distance and even flux across the diamond growth surface, such that the configuration of the implanted species layer will itself replicate the surface profile of the substrate. In turn, any defects on an implanted surface of the substrate will typically have a corresponding influence on the implant profile, including on the configuration of the predetermined peak atomic layer. Thus, such structures may actually be substantially polished if the surface of the diamond is polished. Preparation of the substrate can be important to initially remove such defects. In addition, in certain embodiments, surfaces are thoroughly cleaned for ion implanting, for instance, using solvents or other suitable methods known in the art, including plasma etching, gas phase etching and the like.

Ion implantation is generally conducted under conditions of high vacuum, high voltage, and relatively low beam currents. As is known in the art, ion implantation typically involves the process of ionizing a species of atoms, subsequently accelerating the species in an electric field, and directing the accelerated, ionized species toward a substrate. With its rate of motion being accelerated, the species generally penetrates an outer surface of the substrate and come to rest within a zone in the substrate.

The zone is within an implanted layer of the substrate. In one embodiment, the species is accelerated toward the substrate at an angle generally normal or vertical to the surface. However, the species can also be accelerated toward the substrate at a wide variety of angles as well. For a given species, the depth of implantation is generally accomplished with adjustments made to the electric field. Typically, as one increases the voltage of the electric field, the energy of the species is increased, which ultimately results in a deeper implantation by the species into the substrate. It is fully contemplated that the substrate may be any of a variety of crystalline shapes. For example, the substrate may be of any predetermined geometry including a cube, cone, prism, pyramid, wedge, or other geometries, as well as frustums of each. The implantation depth control and masking may be used to produce electrodes of many different shapes, allowing one to tailor the shape of the electrode as desired.

The species generally penetrates the upper surface of the substrate until reaching a desired zone comprising the shape of the desired electrode. Further implants at various depths may also be employed to form sides of the electrode. A peak concentration of the species is at a certain depth generally known as the end of range depth.

Before ion implantation is started, the species to be implanted must be selected. Many variables are considered in selecting a species, such as cost and availability, as well as concern for how much damage the species is expected to cause to the substrate lattice, as described below.

During ion implantation, by directing the species (of ionized atoms) into the crystal lattice of the substrate, the implanted portion of the lattice generally dilates or expands. Excessive dilation of the lattice in this manner generally leads to strain within the implanted layer. Consequently, excessive strain can cause damage to the implanted layer. This damage is generally represented by dislocations, or cracking, within the implanted layer. These dislocations can generally create an unfavorable outer substrate surface for growing quality synthetic diamond (e.g., producing diamond via CVD having no defects or dislocations, or insignificant amounts thereof). However, the manner in which lattice dilation can be controlled in a number of ways, and in fact, relied upon.

One way involves selecting an appropriate species for implanting. In certain embodiments of the invention, hydrogen ions are implanted within a diamond substrate using the conventional techniques of ion implantation. Since the covalent radius of hydrogen is small, only a small amount of lattice dilation occurs within the implanted layer. Consequently, there is little strain (and little damage) within the implanted layer. Generally, as the covalent radius of the implanted species increases, the potential for creating such a favorable surface (e.g., having limited defects or dislocations) decreases.

Generally, any species can be used for ion implanting in the inventive process so long as the species is suitable for subsequently enabling separation of a portion of the implanted layer from the substrate. As such, the species is selected so as to allow for suitable implantation within the substrate. Examples of such species include most, if not all, atomic elements. In certain embodiments of the invention, the substrate is also used for growing a synthetic diamond thereon. As such, the species preferably allows for suitable implantation within the substrate to enable separation, and allows for suitable formation of a favorable growth surface on the substrate from which a quality synthetic diamond can be grown. Therefore, the species is selected so as to allow for suitable implantation within the substrate without undesirably damaging the substrate. Small- to medium-sized species (having small- to medium-sized covalent radiuses) are generally preferred. Examples include atomic species such as helium, lithium, boron, carbon, oxygen, phosphorous, and sulfur. However, embodiments of the process can also involve large-sized species (having large-sized covalent radiuses). In such embodiments, other parameters affecting the implant of the species, such as species dose quantity and implant energy level, are considered so as to limit the amount of damage to the substrate lattice upon implantation of the larger-sized species.

The extent of lattice damage to the implanted portion can be limited by the dose quantity of the species implanted, with the dose being defined as the area density of atoms (atoms/$cm^2$) which are implanted into the substrate. For example, if the species is implanted using a high dose, the species will generally cause more damage to the substrate upon implantation than if a species were implanted using a lower dose. As the species (of ionized atoms) travels through the substrate, the damage to the substrate lattice is generally maximized near the end of the species range into the substrate (generally referred to as "end of range damage").

In turn, the degree of damage at the end of range is a function of the total dose at that level. However, the ability to cause separation within the diamond crystal is also a function of the total dose. At dose levels that are too low, there will be no separation, while at levels that are too high for a particular embodiment, there can be excessive damage and poor diamond growth. In some embodiments, the dose quantity is set in the range from about $1 \times 10e^{14}$ atoms/$cm^2$ to about $1 \times 10e^{20}$ atoms/$cm^2$, and even more preferably, is set in the range from about $1 \times 10e^{15}$ atoms/$cm^2$ to about $1 \times 10e^{18}$ atoms/$cm^2$. When implanting species of large sizes, in order to limit lattice damage, it is generally preferable to choose a dose quantity on the lower end of the range. Conversely, when implanting species of small to medium sizes, any dose quantity within the range is generally suitable.

In addition, the extent of lattice damage to the diamond growth surface can be controlled by modifying the voltage of the electric field used in ion implantation. As one increases the voltage of the electric field, the energy of the species increases as well, ultimately resulting in a deeper implantation by the species into the substrate. In turn, the energy level can be selected for a specific species so as to implant a peak concentration of the species at about a certain implantation depth within the substrate (the end of range depth). This depth may range anywhere from about 500 angstroms to about 20,000 angstroms. While the end of range depth for the species can be limited by decreasing the species energy, one ought not limit the energy too severely.

In some embodiments of the invention, the energy level is set in the range from about 10 KeV to about 10,000 KeV, and in another embodiment, is set in the range from about 50 KeV to about 500 KeV. When implanting species of large sizes, in order to limit lattice damage of the substrate, it may be desired to select the species energy on the higher end of this range. As such, the large size species are implanted further from the diamond growth surface, thereby attempting to isolate any lattice damage from the diamond growth surface. Conversely, when implanting species of small to medium sizes, the method provides more freedom in selecting the species energy.

The species dose rate may affect the temperature of the substrate during the implant. If the dose rate is too high, unwanted graphitization of the zone of the implanted layer may occur. In some embodiments of this invention, the dose rate is set in the range from about 0.05 microamps/$cm^2$ to about 100 milliamps/$cm^2$, and in others, is set in the range from about 0.1 microamps/$cm^2$ to about 500 microamps/$cm^2$.

In one embodiment, implants at multiple levels, followed by heating are performed to create gaps at different levels of the substrate. One example provides three such gaps by implanting $H_2$ at energy levels of 150, 155 and 160 KeV. This can provide three levels of structures, such as waveguides, with potential corresponding isolated N-V centers.

Given the present description, those skilled in the art will appreciate the manner in which the end of range depth of the species can be determined, given specifics regarding the species implanted and the energy used. Such calculations are generally known as TRIM (Transport of Ions in Matter) calculations. See J. P. Biersack et al., *A Monte Carlo Computer Program for the Transport of Energetic Ions in Amorphous Targets*, Nucl. Instr. Meth., pp. 174:257 (1980), the teachings of which are incorporated herein by reference. See also generally J. F. Ziegler et al., *In the Stopping and Range of Ions in Matter*, Pergamon Press, N.Y., vol. 1 (1985), the teachings of which are incorporated herein by reference. Table 1 lists the approximate end of range depths for various species at various energy levels, given a diamond seed being used as the substrate. Regardless of whether the diamond seed is HPHT, CVD, or natural diamond, the end of range depths for the species generally remain the same. As illustrated, as the energy level is increased for a species such as hydrogen, its end of range depth is also increased. Calculations were run at an energy level of about 200 keV for species including boron and carbon to demonstrate that as the atom diameter of the species increased, the corresponding end of range depth decreased. In addition, it should be noted that in order to achieve similar end of range depths (e.g., 1900 angstroms to 2000 angstroms), energy levels would have to be increased by a factor of four when using carbon as the implant species as opposed to hydrogen.

TABLE 1

Implant Depths as a Function of Atom Implanted and Implant Energy

| Implanted Ion/atom | Implant Energy | | | |
|---|---|---|---|---|
| | 50 keV | 100 keV | 200 keV | 1,000 keV |
| Hydrogen | 1900 Å | 3700 Å | 7200 Å | 63500 Å |
| Boron | | | 2800 Å | |
| Carbon | | | 2000 Å | |

Heat treatments are provided on the diamond composition in the non-oxidizing atmospheres. Such treatments can be provided by any suitable method, including radiation, conduction, or convection sources, all generally known in the art. Generally, the temperature range of the heat treatments is preferably set in the range from about 1100° C. to about 1800° C. and, more preferably, about 1100° C. to about 1500° C. The combination of the appropriate atmosphere and the temperature levels provides an ideal environment to cause spontaneous separation of the synthetic diamond and the implanted layer portion.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. An electrochemical synthesis electrode comprising a CVD boron conductively doped single crystal diamond, wherein the single crystal diamond has a maximum current density greater than that of a polycrystalline diamond.

2. The electrode of claim 1 wherein the single crystal diamond has a boron concentration ranging from approximately 0.005 parts per million to 10,000 parts per million.

3. The electrode of claim 1 wherein the single crystal diamond has a boron concentration ranging from approximately 0.05 parts per million to 3,000 parts per million.

4. The electrode of claim 1 having a resistivity of between approximately 5000 ohm centimeters to approximately 0.01 ohm centimeters.

5. An electrolytic cell comprising:
a container holding an electrolyte;
a conductive anode electrode disposed within the electrolyte, the anode electrode comprising a first non-conductive single crystal diamond layer, a conductively doped single crystal diamond layer formed on the first non-conductive single crystal diamond layer, and a second non-conductive single crystal diamond layer formed on the conductively doped single crystal diamond layer; and
a conductive cathode electrode disposed within the electrolyte.

6. The electrolytic cell of claim 5 and further comprising a power supply electrically coupled to the electrodes.

7. The electrolytic cell of claim 5 and further comprising a baffle disposed in the electrolyte between the electrodes.

8. The electrolytic cell of claim 5, wherein the container has an inlet for water to be purified, and an outlet for water being purified.

9. The electrolytic cell of claim 8 wherein the outlet is positioned downstream from the anode electrode.

10. The electrolytic cell of claim 5 and further comprising an outlet for gas produced at the cathode electrode.

11. The electrolytic cell of claim 5 wherein the cathode comprises conductively doped single crystal diamond.

12. The electrolytic cell of claim 5 wherein the anode further comprises a metal contact and conductor.

13. The electrolytic cell of claim 12 wherein the metal contact is positioned on an end of the anode which may be outside of the electrolyte.

14. The electrolytic cell of claim 5 wherein the first non-conductive single crystal diamond layer comprises holes therethrough and a metal contact that contacts the conductively doped single crystal diamond through such holes.

15. The electrolytic cell of claim 14 and further comprising a conductor coupled to the metal contact.

16. An in situ water purification device comprising:
a sleeve shaped to fit within a neck of a bottle of water to be purified;
a first CVD boron conductively doped single crystal diamond electrochemical synthesis anode electrode extending from the sleeve a first distance; and
a second conductive cathode electrode extending from the sleeve a second distance, wherein the first conductive electrode and the second conductive electrode each has a maximum current density greater than that of a polycrystalline diamond.

17. The water purification device of claim 16 wherein the first distance is longer than the second distance, such that the anode extends further into the water to be purified.

18. The water purification device of claim 16 and further comprising conductors extending from the electrodes for coupling to a power supply.

19. The water purification device of claim 16 and further comprising a baffle disposed between the electrodes.

20. An electrolytic cell comprising:
a container for holding an electrolyte;
a conductively doped single crystal diamond anode electrode positioned to be disposed within the electrolyte the anode electrode comprising a first non-conductive single crystal diamond layer, a conductively doped single crystal diamond layer formed on the first non-conductive single crystal diamond layer, and a second non-conductive single crystal diamond layer formed on the conductively doped single crystal diamond layer;
a conductive cathode electrode positioned to be disposed within the electrolyte;
conductors coupled to the electrodes for coupling to a power supply;
an electrolyte inlet and an electrolyte outlet coupled to the container for causing electrolyte to flow past the electrodes, wherein the anode electrode is downstream from the cathode electrode; and
wherein the anode is able to operate at a current density of approximately 3,000 amps per square centimeter for approximately 500 hours with substantially no detectable evidence of erosion.

21. The electrolytic cell of claim 20 and further comprising an outlet for gas produced at the cathode electrode.

22. The electrolytic cell of claim 20 and further comprising a baffle disposed in the electrolyte between the electrodes.

23. The electrode of claim 1 wherein the single crystal diamond has a maximum current density between approximately 1,000 amps per square-centimeter and 3,000 amps per square centimeter.

24. The electrode of claim 1 wherein the single crystal diamond has a boron concentration ranging from approximately 3,000 parts per million to 10,000 parts per million.

25. An electrochemical synthesis electrode comprising a CVD boron conductively doped single crystal diamond, wherein the single crystal diamond has a nitrogen concentration substantially below normal levels, and wherein the single crystal diamond has a maximum current density greater than that of a polycrystalline diamond.

26. The electrode of claim 25 wherein the single crystal diamond has a carbon isotope concentration at normal or near-normal levels.

27. An electrochemical synthesis electrode comprising a CVD boron conductively doped single crystal diamond, wherein the single crystal diamond has a maximum current density greater than that of a polycrystalline diamond, and wherein the single crystal diamond has affects to increase surface area.

28. The electrode of claim 27 wherein the affects include through holes.

29. The electrode of claim 27 wherein the affects include valleys.

30. The electrode of claim 27 wherein the affects transform the single crystal diamond into a porous membrane for water to flow through.

31. The electrode of claim 27 and further comprising a contact formed on an end of the single crystal diamond, wherein the contact is coupled to a conductor, and wherein the contact and conductor are insulated from an electrolyte when the electrode is immersed in the electrolyte.

32. The electrochemical synthesis electrode of claim 1, wherein the single crystal diamond has a maximum current density greater than approximately 1000 amps per square centimeter.

\* \* \* \* \*

UNITED STATES PATENT AND TRADEMARK OFFICE
CERTIFICATE OF CORRECTION

PATENT NO. : 8,591,856 B2  
APPLICATION NO. : 11/277866  
DATED : November 26, 2013  
INVENTOR(S) : Doering et al.

Page 1 of 4

It is certified that error appears in the above-identified patent and that said Letters Patent is hereby corrected as shown below:

On the title page, in column 1, under "(75) Inventors", line 2, delete "Wellifleet" and insert --Wellfleet--, therefor On the title page, in column 2, under "Other Publications", line 1, delete "Pupunat et al Electrochemical" and insert --Pupunat, et al., "Electrochemical--, therefor On the title page, in column 2, under "Other Publications", line 1, delete "doepd" and insert --doped--, therefor On the title page, in column 2, under "Other Publications", line 2, delete "electrodes," and insert --electrodes",--, therefor On the title page, in column 2, under "Other Publications", line 2, delete "2001" and insert --2001,--, therefor On title page 2, in column 2, under "Other Publications", line 12, delete "Dlffusivity" and insert --Diffusivity--, therefor On title page 2, in column 2, under "Other Publications", line 12, delete "Isotropically" and insert --Isotopically--, therefor On title page 2, in column 2, under "Other Publications", line 19, delete "NY,(1962)," and insert --NY, (1962),--, therefor On title page 2, in column 2, under "Other Publications", line 21, delete "Reinhold,(1990)," and insert --Reinhold, (1990),--, therefor On title page 2, in column 2, under "Other Publications", line 26, delete "J.E." and insert --J. E.--, therefor Signed and Sealed this  
Ninth Day of December, 2014

Michelle K. Lee  
*Deputy Director of the United States Patent and Trademark Office*

On title page 2, in column 2, under "Other Publications", line 33, delete "J.E." and insert --J. E.--, therefor On title page 2, in column 2, under "Other Publications", line 46, delete "Thins," and insert --Films--, therefor On title page 2, in column 2, under "Other Publications", line 53-54, delete "Isotopically" and insert --isotopically--, therefor On title page 2, in column 2, under "Other Publications", line 56, delete "Isotope" and insert --Isotopic--, therefor On title page 3, in column 1, under "Other Publications", line 6, delete "Seitz" and insert --Seitz,--, therefor On title page 3, in column 1, under "Other Publications", line 7, delete "NY,(1958)," and insert --NY, (1958),--, therefor On title page 3, in column 1, under "Other Publications", line 12, delete "J.E." and insert --J. E.--, therefor On title page 3, in column 1, under "Other Publications", line 14, delete ""Dilation," and insert --"Dilatation,--, therefor On title page 3, in column 1, under "Other Publications", line 14, delete "1a" and insert --Ia--, therefor On title page 3, in column 1, under "Other Publications", line 20, delete "TS.," and insert --T. S.,--, therefor On title page 3, in column 1, under "Other Publications", line 20, delete "Homoepotaxial" and insert --Homoepitaxial--, therefor On title page 3, in column 1, under "Other Publications", line 25, delete "M.A.," and insert --M. A.,--, therefor On title page 3, in column 1, under "Other Publications", line 25-26, delete "Inc., (1998),147-192." and insert --Inc. (1998), 147-192.--, therefor On title page 3, in column 1, under "Other Publications", line 30, delete "M A.," and insert --M. A.,--, therefor On title page 3, in column 1, under "Other Publications", line 41, delete "CHemical" and insert --Chemical--, therefor

CERTIFICATE OF CORRECTION (continued)

U.S. Pat. No. 8,591,856 B2

On title page 3, in column 1, under "Other Publications", line 50, delete "Schotty" and insert --Schottky--, therefor On title page 3, in column 1, under "Other Publications", line 52, delete "(letters);" and insert --(letters),--, therefor On title page 3, in column 2, under "Other Publications", line 5, after "Letters", insert --,--, therefor In the Specification In column 1, line 7, delete "10/977,267" and insert --10/977,267,--, therefor In column 1, line 47, delete "deoderizing" and insert --deodorizing--, therefor In column 1, line 59, after "however", insert --,--, therefor In column 2, line 31, delete "sp2" and insert --$sp^2$--, therefor In column 2, line 35, delete "sp2" and insert --$sp^2$--, therefor In column 3, line 46, delete "O2" and insert --$O_2$--, therefor In column 3, line 56, delete "occuning" and insert --occurring--, therefor In column 3, line 65, (Approx), delete "H20+2 e→H2+½O2" and insert --$H_2O+2e \rightarrow H_2+\frac{1}{2}O_2$--, therefor In column 3, line 67, (Approx), delete "O+O2→O3" and insert --$O+O_2 \rightarrow O_3$--, therefor In column 4, line 12, after "helps", insert --to--, therefor In column 4, line 27, delete "CO2" and insert --$CO_2$--, therefor In column 4, line 56, delete "cm2" and insert --$cm^2$--, therefor In column 5, line 47, delete "gooup." and insert --group.--, therefor In column 5, line 59, after "the", insert --electrical--, therefor In column 6, line 11, after "portion", delete "365", therefor In column 6, line 19, delete "wire" and insert --the electrical conductor--, therefor In column 6, line 31, delete "metalization" and insert --metallization--, therefor

CERTIFICATE OF CORRECTION (continued)
U.S. Pat. No. 8,591,856 B2

In column 6, line 44, delete "210" and insert --310--, therefor

In column 6, line 45, delete "SiO2" and insert --$SiO_2$--, therefor

In column 6, line 48, delete "SiO2" and insert --$SiO_2$--, therefor

In column 9, line 66, delete "lb" and insert --Ib--, therefor

In column 10, line 43, delete "um" and insert --μm--, therefor

In column 10, line 43, delete "um" and insert --μm--, therefor

In column 10, line 43, delete "um" and insert --μm--, therefor

In column 10, line 58, delete "(HCFVD)" and insert --(HFCVD)--, therefor

In column 11, line 43, (Approx), delete "(HCFVD)" and insert --(HFCVD)--, therefor In column 12, line 10, delete "co doped" and insert --codoped--, therefor In column 12, line 31, delete "(HCFVD)" and insert --(HFCVD)--, therefor In column 15, line 62, delete "KeV" and insert --keV--, therefor In column 15, line 62, delete "KeV" and insert --keV,--, therefor In column 15, line 63, delete "KeV" and insert --keV--, therefor In column 15, line 64, delete "KeV" and insert --keV.--, therefor In column 16, line 16, delete "KeV" and insert --keV.--, therefor